(12) United States Patent
Koeneman et al.

(10) Patent No.: US 7,032,392 B2
(45) Date of Patent: Apr. 25, 2006

(54) METHOD AND APPARATUS FOR COOLING AN INTEGRATED CIRCUIT PACKAGE USING A COOLING FLUID

(75) Inventors: Paul B. Koeneman, Hillsboro, OR (US); Mark A. Trautman, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 449 days.

(21) Appl. No.: 10/028,860

(22) Filed: Dec. 19, 2001

(65) Prior Publication Data

US 2003/0110788 A1    Jun. 19, 2003

(51) Int. Cl.
F25B 45/00    (2006.01)

(52) U.S. Cl. .......................................... 62/77; 62/259.2

(58) Field of Classification Search ............... 62/259.2, 62/77; 165/80.3, 80.4; 361/699
See application file for complete search history.

(56) References Cited

U.S. PATENT DOCUMENTS

| | | | | |
|---|---|---|---|---|
| 3,921,201 A | * | 11/1975 | Eisele et al. ................. | 257/714 |
| 4,738,272 A | * | 4/1988 | McConnell ................... | 134/59 |
| 5,023,695 A | * | 6/1991 | Umezawa et al. ........... | 257/714 |
| 5,349,831 A | * | 9/1994 | Daikoku et al. ............. | 165/80.4 |
| 5,361,188 A | * | 11/1994 | Kondou et al. .............. | 361/695 |
| 5,396,403 A | * | 3/1995 | Patel .......................... | 165/80.3 |
| 5,436,501 A | * | 7/1995 | Ikeda ......................... | 257/714 |
| 5,459,352 A | * | 10/1995 | Layton et al. ............... | 257/713 |
| 5,514,906 A | * | 5/1996 | Love et al. .................. | 257/712 |
| 5,592,363 A | * | 1/1997 | Atarashi et al. ............. | 361/689 |
| 5,615,084 A | * | 3/1997 | Anderson et al. ........... | 361/697 |
| 5,637,921 A | * | 6/1997 | Burward-Hoy ............. | 165/80.2 |
| 5,705,850 A | * | 1/1998 | Ashiwake et al. .......... | 257/714 |
| 5,763,950 A | * | 6/1998 | Fujisaki et al. ............. | 257/712 |
| 5,770,478 A | * | 6/1998 | Iruvanti et al. ............. | 438/118 |
| 5,825,087 A | * | 10/1998 | Iruvanti et al. ............. | 257/707 |
| 5,841,244 A | * | 11/1998 | Hamilton et al. ....... | 165/104.26 |
| 5,880,524 A | * | 3/1999 | Xie ............................. | 257/704 |
| 5,883,783 A | * | 3/1999 | Turturro ..................... | 165/80.3 |
| 5,889,652 A | * | 3/1999 | Turturro ..................... | 257/713 |
| 5,990,418 A | * | 11/1999 | Bivona et al. ............. | 174/52.4 |
| 6,023,413 A | * | 2/2000 | Umezawa ................... | 361/697 |
| 6,036,023 A | * | 3/2000 | Pfahnl et al. ............... | 206/725 |
| 6,055,154 A | * | 4/2000 | Azar .......................... | 165/80.3 |
| 6,188,578 B1 | * | 2/2001 | Lin et al. .................... | 165/80.3 |
| 6,191,599 B1 | * | 2/2001 | Stevens ...................... | 324/760 |
| 6,226,994 B1 | * | 5/2001 | Yamada et al. .............. | 62/3.7 |
| 6,317,326 B1 | * | 11/2001 | Vogel et al. ................ | 165/80.4 |
| 6,348,364 B1 | * | 2/2002 | Bruce et al. ................ | 438/108 |
| 6,351,384 B1 | * | 2/2002 | Daikoku et al. ............ | 361/704 |
| 6,377,453 B1 | * | 4/2002 | Belady ....................... | 361/687 |
| 6,459,581 B1 | * | 10/2002 | Newton et al. ............. | 361/700 |

FOREIGN PATENT DOCUMENTS

JP    10055421 A   *   2/1998

* cited by examiner

Primary Examiner—Mohammad M. Ali
(74) Attorney, Agent, or Firm—Glen B. Choi

(57) ABSTRACT

A method and apparatus for cooling an integrated circuit die. An integrated circuit package comprises an integrated circuit die. A cooling fluid makes contact with the integrated circuit die. In one embodiment, an interposer is disposed between the integrated circuit die and a package substrate. The integrated circuit die and/or the interposer may have microchannels in its surface.

28 Claims, 4 Drawing Sheets

METHOD AND APPARATUS FOR COOLING AN INTEGRATED CIRCUIT PACKAGE USING A COOLING FLUID

BACKGROUND OF THE INVENTION

1. Field of the Invention

The described invention relates to the field of integrated circuit packages. In particular, the invention relates to an apparatus and method of cooling an integrated circuit package.

2. Description of Related Art

An integrated circuit package houses an integrated circuit die. The integrated circuit die may generate a substantial amount of heat and may require substantial cooling to prevent the integrated circuit from overheating. In some cases, large heat sinks with fans are attached to the outside of the integrated circuit package.

FIG. 1 is a schematic diagram that shows a prior art integrated circuit package 5. An integrated circuit die 10 is typically made from a semiconductor material such as silicon. The electrical components are formed on one side of the integrated circuit die, herein referred to as the "active surface" of the integrated circuit die.

The active surface 12 of the integrated circuit die 10 is electrically coupled to the package substrate 20 via solder bumps 30. In one embodiment, hundreds of solder bumps 30 may be used to provide electrical connectivity between the package substrate 20 and the integrated circuit die 10. In some cases the coefficient of expansion of the silicon integrated circuit die 10 may be many times lower than that of the package substrate 20. An underfill material 40 is used to fill the areas around the solder bumps between the integrated circuit die 10 and the package substrate 20 and helps to reduce the stresses caused by the difference in thermal expansion of the two materials.

A heat spreader 50 covers the integrated circuit die and forms an air-filled chamber 52. In some cases, a thermal material 54 is placed between the integrated circuit die and the heat spreader to help conduct heat away from the integrated circuit die 10.

Various types of leads 60 extend from the integrated circuit package 5. These leads are used to couple the integrated circuit package to a printed circuit board. The leads 60 may be any of various types such as solder bumps, ball grid array (BGA), pin grid array (PGA), surface mount, and so forth.

DETAILED DESCRIPTION

A method and apparatus for cooling an integrated circuit die is described. An integrated circuit package comprises a package substrate, an integrated circuit die having an active surface, and a cooling fluid. In one embodiment, an interposer is disposed between the package substrate and the integrated circuit die. The interposer establishes electrical connectivity between the integrated circuit die and the package substrate. In one embodiment, the cooling fluid is in contact with the active surface of the integrated circuit die. The integrated circuit die and/or the interposer may have a surface having microchannels ("a microchannel surface") that allows the cooling fluid to make better contact with the integrated circuit die and interposer, respectively.

Figure 1:
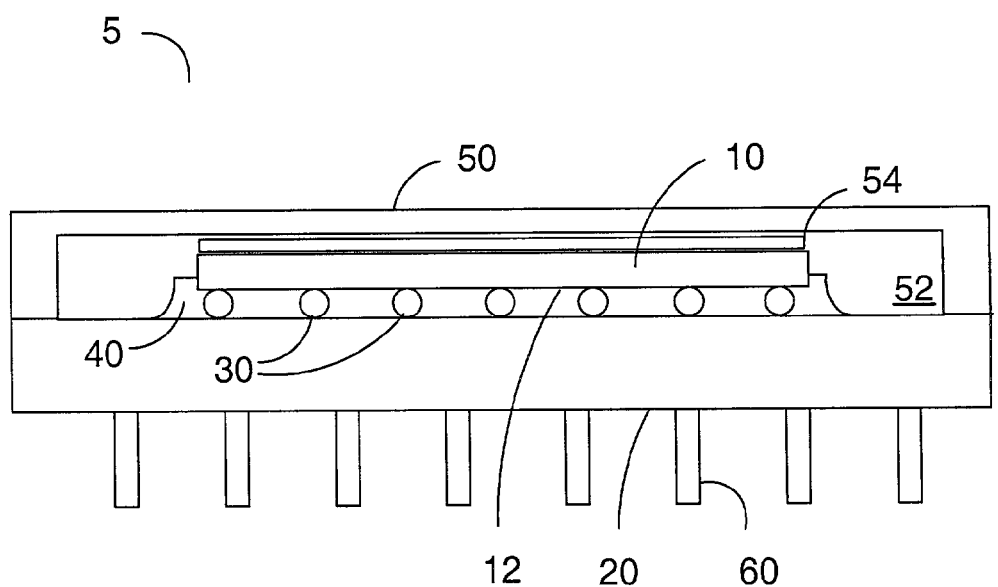
FIG. 1 is a schematic diagram that shows a prior art integrated circuit package.
Figure 2:
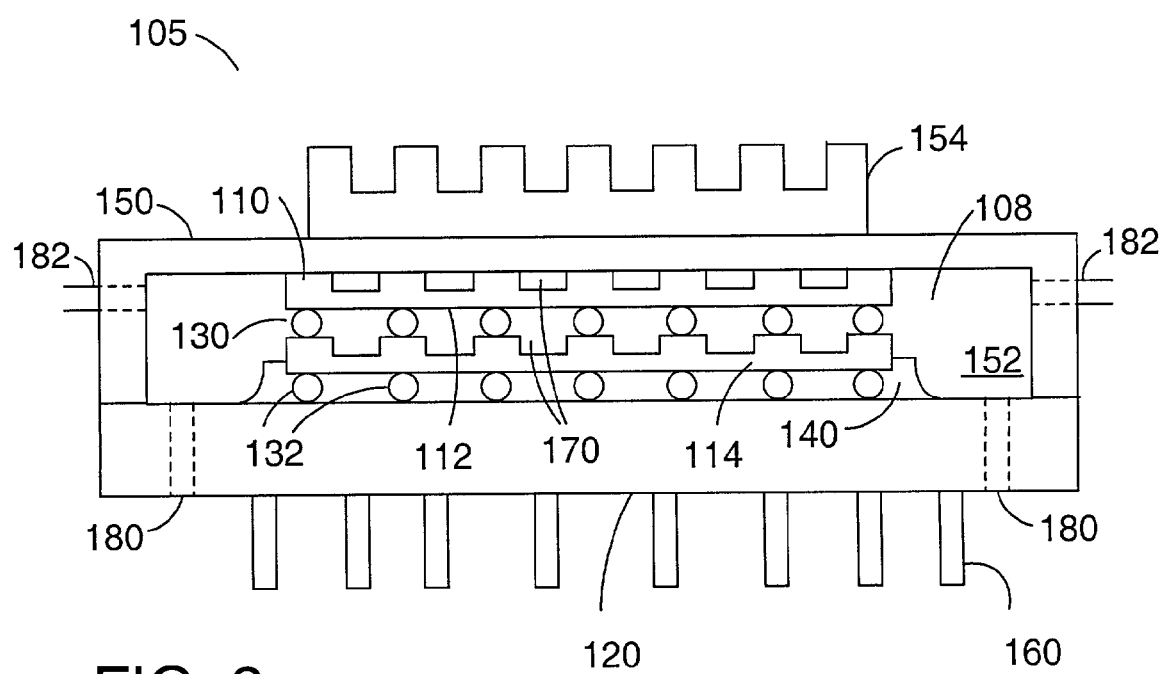
FIG. 2 is a schematic diagram that shows one embodiment of an integrated circuit package having a cooling fluid.

FIG. 2 is a schematic diagram that shows one embodiment of an integrated circuit package 105 having a cooling fluid 108. An integrated circuit die 110 is coupled to an interposer 114 that provides electrical connectivity between the integrated circuit die 110 and the package substrate 120. In one embodiment, the integrated circuit die 110 is coupled to the interposer 114 via solder bumps 130, and the interposer 114 is also coupled to the package substrate 120 via solder bumps 132. An underfill material 140 fills the space between the interposer 114 and the package substrate 120. In one embodiment, both the integrated circuit die 110 and the interposer 114 comprise the same material. Therefore, the coefficients of thermal expansion of the integrated circuit die 110 and the interposer 114 are the same. This minimizes the creation of thermal stress, and therefore, no underfill material is needed to help couple the integrated circuit die 110 to the interposer 114.

In one embodiment, the interposer 114 may provide electrical functionality in addition to electrical connectivity. For example, the interposer 114 may add capacitance to various nodes of the integrated circuit die 110. In one embodiment, the interposer 114 may comprise a second integrated circuit die that provides additional functionality. For example, the interposer 114 may serve as an optical to electrical interface for the first integrated circuit die 110. Thus, an optical signal may be input to the interposer 114, which provides a corresponding electrical signal to the first integrated circuit die 110.

A gap between the integrated circuit die 110 and the interposer 114 allows cooling fluid 108 to circulate between the two. Thus, the cooling fluid 108 makes contact with the active surface 112 of the integrated circuit die 110 and cools the integrated circuit die 110.

In one embodiment, the active surface of the integrate circuit die 110 is protected through a passivation layer (not shown), and the cooling fluid 108 is selected to be non-reactive with the passivation layer. In one example, the passivation layer may comprise polyimide.

The cooling fluid 108 may be any of various commercially available products. For example, the 3M Performance Materials Division of St. Paul, Minn. provides a family of fluorocarbon liquids (sold under the trademark brand name "Fluorinert") that range in boiling point from 56 degrees C. to 253 degrees C. The cooling fluid 108 may be selected based on the one most suited to the particular temperatures expected to be produced within the integrated circuit package 105. It should be noted that although the term "cooling fluid" has been used herein, the cooling fluid may exist in liquid and/or gas phases throughout different portions of the system.

In one embodiment, a cooling fluid 108 is selected that will change phase to yield an efficient thermal exchange.

The phase change allows a higher rate of heat transfer at a low temperature drop. In one example, the cooling fluid 108 may evaporate as it moves across a hotter portion of the system, such as the active surface of the integrated circuit die, and may condense at a cooler portion of the system, such as at a heat spreader 150, that may additionally be coupled to a heat sink 154.

Cooling the active surface of the integrated circuit die, in particular, helps cool hot spots on the active surface and yields a more uniform surface temperature of the integrated circuit die. This allows more power to be dissipated by the integrated circuit die, even if the mean temperature of the active surface remains the same.

Heat spreader 150 covers the integrated circuit die 110 and the interposer 114 to form a chamber 152. In one embodiment, the cooling fluid 108 fills the entire chamber 152. A thermal material (not shown) may be placed between the integrated circuit die 110 and the heat spreader 150 to help conduct heat away from the integrated circuit die 110. Leads 160 allow attachment of the integrated circuit package to, for example, a printed circuit board. The leads 160 may be any of various types such as solder bumps, ball grid array (BGA), pin grid array (PGA), surface mount, and so forth.

In one embodiment, the integrated circuit die 110 and/or the interposer 114 may have a surface having microchannels 170 ("a microchannel surface") that allows the cooling fluid 108 to make better contact with the integrated circuit die 110 and interposer 114, respectively.

In one embodiment, the microchannels 170 are formed via any of various micromachining techniques such as etching or using a focused ion beam. However, the microchannels 170 may alternatively be formed via other techniques such as, but not limited to, milling. In one embodiment, the microchannels 170 may have a depth of approximately half the depth of the integrated circuit die 110 and/or interposer 114.

In one embodiment, two or more vias 180 in the package substrate 120 may be used to fill the chamber 152 with cooling fluid 108. One via may be used as an input as a second via allows air to escape the chamber 152. After the chamber 152 is filled, the vias 180 may be sealed, for example, by solder. In an alternate embodiment, two or more openings 182 through the heat spreader 150 may be used to fill the chamber 152. One opening may be used as an inlet, and the other opening may be used to allow air to escape. The openings 182 are sealed after the chamber 152 is filled with cooling fluid 108. In one embodiment, the openings 182 may be pinched closed.

Figure 3:
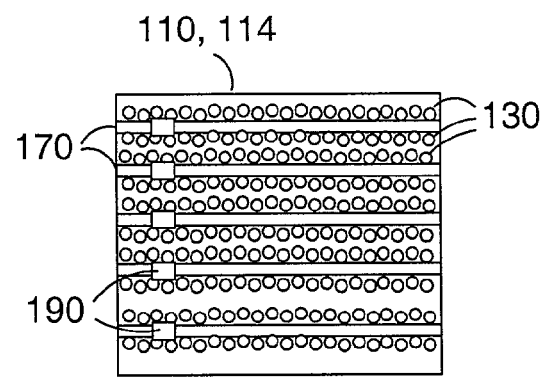
FIG. 3 is a schematic diagram that shows one embodiment of a top view of a microchannel surface.

FIG. 3 is a schematic diagram that shows one embodiment of a top view of a microchannel surface such as that of the integrated circuit die 110 or the interpose 114. In one embodiment, electrical connection to the microchannel surface may be achieved through solder bumps 130, such as those between the integrated circuit die 110 and the interpose 114. The solder bumps 130 may help form channels that funnel the cooling fluid substantially along the same path as the microchannels 170.

In one embodiment, a plurality of Micro-electromechanical system (MEMS) pumps are used to circulate cooling fluid 108 through the microchannels 170 of the integrated circuit die 110 and/or interposer 114.

MEMS is a technology that enables the miniaturization of electrical and mechanical structures. MEMS is a field created primarily in the silicon area, where the mechanical properties of silicon (or other materials such as aluminum, gold, etc.) are used to create miniature moving components. However, MEMS can also be applied to GaAs, quartz, glass and ceramic substrates. Using MEMS technology, various types of mechanical and non-mechanical pumps may be implemented.

Mechanical pumps include piezo-electric pumps and thermo pneumatic peristaltic pumps. These pumps typically use a membrane which, when pressure is exerted on the membrane, restricts or allows fluid flow as desired.

Non-mechanical pumps include electrokinetic pumps. Electrokinetic pumps use an ionic fluid and a current imposed at one end of the channel and collected at the other end of the channel. This current in the ionic fluid impels the ionic fluid towards the collection pad of the electrokinetic pump.

Another type of non-mechanical pump uses thermal bubbles to pump fluids through a microchannel. A heater heats the fluid until a bubble forms. The bubble exerts pressure to move the fluid. By arranging and controlling the heaters in a controlled manner, net movement of the cooling fluid may be achieved.

In one embodiment, a MEMS pump 190 is located in one or more microchannels to circulate the cooling fluid 108 through the microchannels 170.

Figure 4:
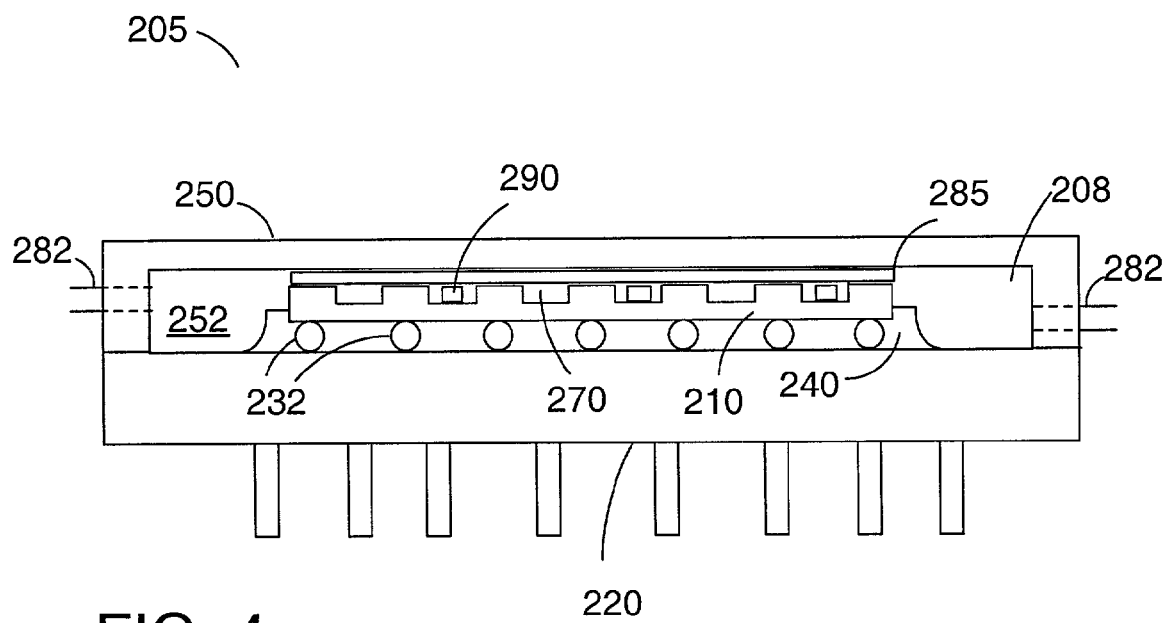
FIG. 4 shows an alternate embodiment of an integrated circuit package having a cooling fluid.

FIG. 4 shows an alternate embodiment of an integrated circuit package 205 having a cooling fluid 208. An integrated circuit die 210 is coupled to a package substrate 220 via solder bumps 232 and an underfill material 240. The surface of the integrated circuit die 210 has microchannels 270. In one embodiment, MEMS pumps 290 are located in or near the microchannels 270 and help circulate cooling fluid 208 through the microchannels 270. In one embodiment, a thermal material 285 helps couple the integrated circuit die 210 to a heat spreader 250. In one embodiment, openings 282 or vias (not shown) may be used to fill the internal chamber 252 with the cooling fluid 208.

Figure 5:
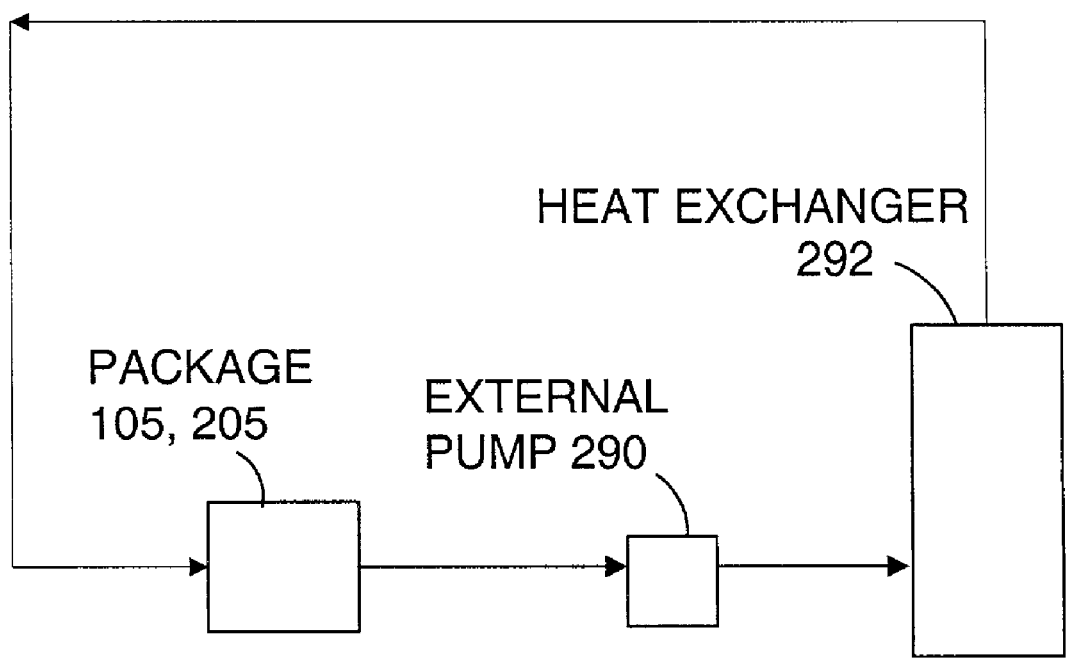
FIG. 5 is a block diagram that shows an embodiment of using an external pump to help cool the integrated circuit package.

FIG. 5 is a block diagram that shows an embodiment of using an external pump 290 to help cool an integrated circuit package 105,205. In one embodiment, the external pump 290 is coupled to openings 182,282 of the integrated circuit package. The external pump 290 circulates the cooling fluid 108, 208 within the integrate circuit package. In one embodiment, the external pump 290 circulates the cooling fluid to a heat exchanger 292 remote from the integrated circuit package, which may substantially improve the cooling efficiency of the system.

Figure 6:
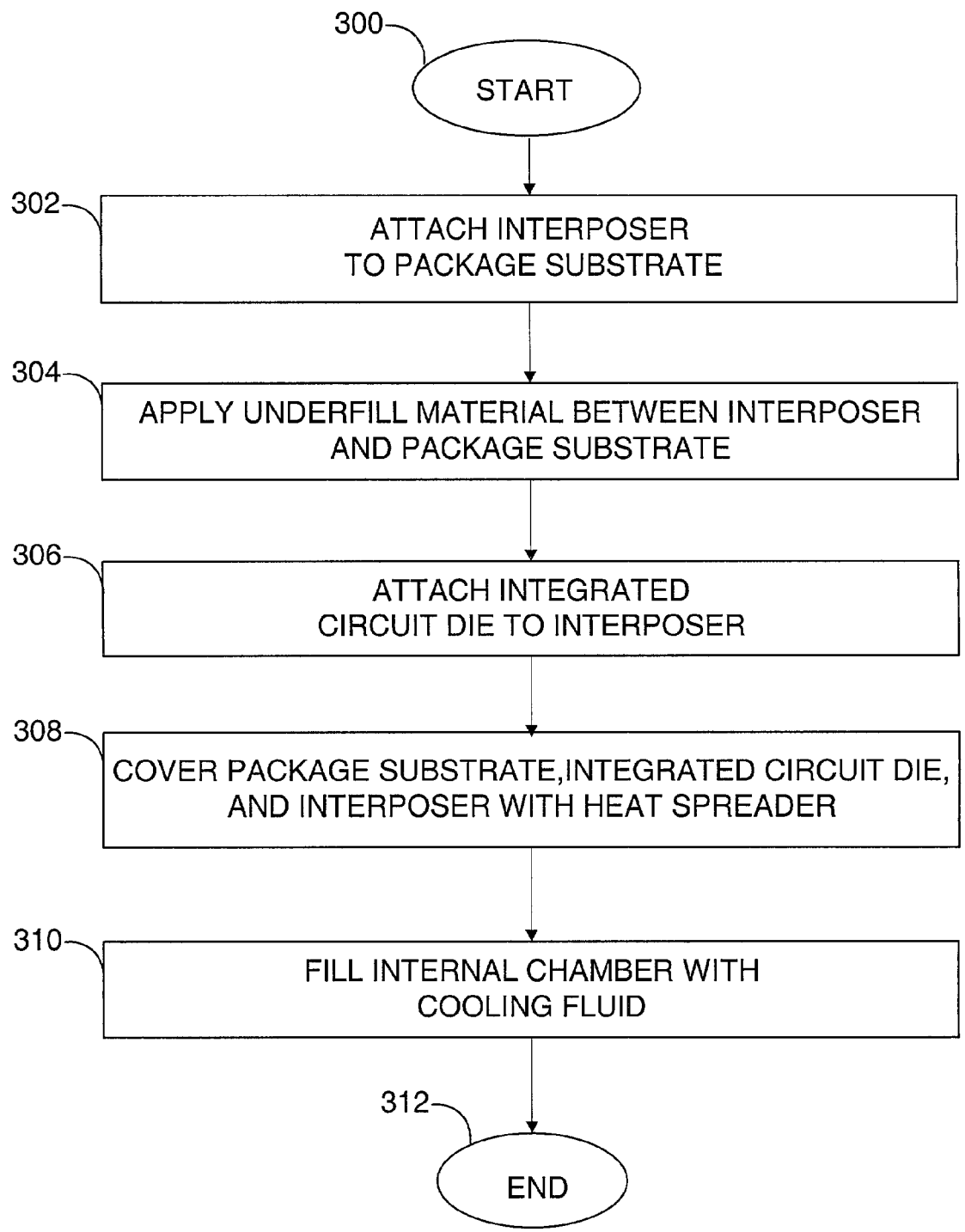
FIG. 6 is a flowchart showing an embodiment of one method of forming an integrated circuit package having a cooling fluid.

FIG. 6 is a flowchart showing an embodiment of one method of forming an integrated circuit package 105 having a cooling fluid 108. The flowchart begins at block 300, and continues at block 302, at which the interposer 114 is attached to the package substrate 120. In one embodiment, the interposer 114 is attached to the package substrate 120 via solder bumps. In one embodiment, the interposer 114 is positioned and then heated until the solder bumps melt to form an electrical connection with the package substrate 120. At block 304, an underfill material is applied to the interposer and allowed to fill the space between the interposer 114 and the package substrate 120.

The flowchart continues at block 306, at which the integrated circuit die 110 is attached to the interposer 114. In one embodiment, the integrated circuit die 110 is attached to the interposer 114 via solder bumps by heating the integrated circuit die 110 until the solder bumps melt to form the electrical connection. At block 308, the substrate 120, the integrated circuit die 110 and the interposer 114 are covered with a heat spreader 150, and create an internal chamber 152. The internal chamber 152 is filled with cooling fluid 108 at block 310. In one embodiment, this may be achieved by filling the chamber 152 using openings through the package substrate 120, such as through vias 180 (see FIG. 2). In an alternative embodiment, this may be achieved through openings 182 (see FIG. 2) in the heat spreader 150.

Thus, a method and apparatus for cooling an integrated circuit die is disclosed. However, the specific embodiments and methods described herein are merely illustrative. Numerous modifications in form and detail may be made without departing from the scope of the invention as claimed below. The invention is limited only by the scope of the appended claims.

What is claimed is:

1. An integrated circuit package comprising:
an integrated circuit die having an active surface; and
a cooling fluid to directly contact and move laterally across the active surface.

2. The integrated circuit package of claim 1 further comprising:
an interposer coupled to the integrated circuit die.

3. The integrated circuit package of claim 2, wherein the interposer has a microchannel surface that allows the cooling fluid to flow between the interposer and the active surface of the integrated circuit die.

4. The integrated circuit package of claim 2 further comprising:
a package substrate, wherein a first side of the interposer is coupled to the package substrate via solder bumps, and a second side of the interposer is coupled to the integrated circuit die via solder bumps.

5. The integrated circuit package of claim 4 further comprising:
an underfill material disposed substantially between the interposer and the package substrate.

6. The integrated circuit package of claim 1, wherein the integrated circuit die has a microchannel surface.

7. The integrated circuit package of claim 1 further comprising:
a pump to circulate the cooling fluid.

8. A method of forming an integrated circuit package comprising:
attaching an interposer to a package substrate;
attaching an integrated circuit die to the interposer, wherein the integrated circuit die includes an active region;
covering the package substrate, the integrated circuit die, and the interposer with a heat spreader to form an internal chamber;
filling the internal chamber with a cooling fluid, wherein the cooling fluid contacts a region between the interposer and the integrated circuit die and wherein the cooling fluid is to directly contact and move laterally across the active region.

9. The method of claim 8, wherein the filling of the internal chamber is done by pumping cooling fluid through a via in the package substrate.

10. A method of forming an integrated circuit package comprising:
attaching an interposer to a package substrate;
attaching an integrated circuit die to the interposer;
covering the package substrate, the integrated circuit die, and the interposer with a heat spreader to form an internal chamber;
filling the internal chamber with a cooling fluid by pumping cooling fluid through a via in the package substrate and
sealing the via after the internal chamber is filled.

11. A method of forming an integrated circuit package comprising:
attaching an interposer to a package substrate;
attaching an integrated circuit die to the interposer;
covering the package substrate, the integrated circuit die, and the interposer with a heat spreader to form an internal chamber;
filling the internal chamber with a cooling fluid by pumping cooling fluid through an inlet and sealing closed the inlet when the filling is complete.

12. A method of cooling an integrated circuit die within an integrated circuit package comprising:
providing power to the integrated circuit die; and
moving a cooling fluid laterally across and in direct contact with an active surface of the integrated circuit die.

13. The method of claim 12, wherein the moving of the cooling fluid is performed by thermal convection.

14. The method of claim 12, wherein the moving of the cooling fluid is performed by a pump located inside of the integrated circuit package.

15. The method of claim 12, wherein the moving of the cooling fluid is performed by a pump located outside of the integrated circuit package.

16. The method of claim 12, wherein the cooling fluid changes phase by evaporating at a first location of the integrated circuit package and condensing at a second location of the integrated circuit package.

17. An integrated circuit package comprising:
a package substrate;
a first integrated circuit die having an active surface;
an interposer disposed between the package substrate and the first integrated circuit die, the interposer establishing electrical connectivity between the first integrated circuit die and the package substrate; and
a cooling fluid disposed between the first integrated circuit die and the interposer, wherein the cooling fluid is to directly contact and move laterally across the active surface.

18. The integrated circuit package of claim 17 further comprising:
a heat spreader covering the package substrate, the first integrated circuit die, the cooling fluid, and the interposer.

19. The integrated circuit package of claim 18 further comprising:
a heat sink coupled to the heat spreader.

20. The integrated circuit package of claim 18, wherein the first integrated circuit die has a microchannel surface in contact with the heat spreader, the microchannel surface allowing cooling fluid to flow across the microchannel surface.

21. The integrated circuit package of claim 17, wherein the interposer provides electrical functionality in addition to electrical connectivity.

22. The integrated circuit package of claim 21, wherein the interposer provides capacitance.

23. The integrated circuit package of claim 21, wherein the interposer comprises a second integrated circuit die.

24. The integrated circuit package of claim 23, wherein the second integrated circuit provides an optical to electrical interface for the first integrated circuit die.

25. The integrated circuit package of claim 17, wherein the interposer has a microchannel surface in contact with the active surface of the first integrated circuit die.

26. An integrated circuit package comprising:
a integrated circuit die housed within a chamber, wherein the integrated circuit die includes an active region; and a cooling fluid filling the chamber and to directly contact and move laterally across the active region of the integrated circuit die.

27. The integrated circuit package of claim 26 further comprising:
a plurality of microchannels in a surface of the integrated circuit die.

28. The integrated circuit package of claim 27 further comprising:
a pump located within the integrated circuit package to pump the cooling fluid through at least a portion of the plurality of microchannels.

* * * * *